United States Patent [19]

Soszek

[11] Patent Number: 4,710,253
[45] Date of Patent: Dec. 1, 1987

[54] METHOD FOR MANUFACTURING A CIRCUIT BOARD

[75] Inventor: Peter Soszek, Winnipeg, Canada

[73] Assignee: Somich Technology Inc., Winnipeg, Canada

[21] Appl. No.: 739,192

[22] Filed: May 30, 1985

[30] Foreign Application Priority Data

Jun. 4, 1984 [GB] United Kingdom ............... 8414178

[51] Int. Cl.$^4$ ............................................. B32B 31/28
[52] U.S. Cl. .............................. 156/272.8; 156/273.7; 156/275.3; 219/121 LF; 219/121 LY
[58] Field of Search ............. 174/68.5; 427/43.1, 427/96, 53.1; 428/901; 219/121 L, 121 LC, 121 LD, 121 LE, 121 LF, 121 LJ, 121 LY, 121 LM; 430/945; 156/272.8, 273.7, 275.1, 275.3, 298

[56] References Cited

U.S. PATENT DOCUMENTS

| 3,214,315 | 10/1965 | Hildebrand | 156/303.1 |
| 3,396,401 | 8/1968 | Nonomura | 430/1 |
| 3,945,318 | 3/1976 | Landsman | 430/201 |
| 4,081,653 | 3/1978 | Koo | 219/121 LM |
| 4,159,414 | 6/1979 | Suh | 219/121 LM |
| 4,496,607 | 1/1985 | Mathias | 427/53.1 |

*Primary Examiner*—Donald E. Czaja
*Assistant Examiner*—Merrell C. Cashion, Jr.
*Attorney, Agent, or Firm*—Adrian D. Battison; Stanley G. Ade; Murray E. Thrift

[57] ABSTRACT

A circuit board is manufactured by applying a film of heat actuable adhesive to a substrate and depositing on the film a layer of a conductive powder. The powder and film are then activated by laser radiation or by direct contact with a heated plate. The excess powder is then removed and the substrate fired to cure or bond the powder to the substrate while removing excess adhesive film.

15 Claims, 5 Drawing Figures

METHOD FOR MANUFACTURING A CIRCUIT BOARD

BACKGROUND OF THE INVENTION

This invention relates to the manufacture of circuitry, for example, in the form generally known as printed circuit boards. Such boards are manufactured by a number of different techniques. The most common is that using a photographic printing and etching technique to leave a conductive network on a non-conductive layer. This however is a complex multi-step procedure which generates significant waste materials and does not allow ready re-design of the circuit to be produced.

One alternative is a technique using screen printing of an organic resin containing conductive ink and when curing and firing the ink. This again produces undesirable waste and also gives little flexibility for design changes.

There remain therefore requirements for other processes which have advantages over the known techniques relating to reduced waste or increased flexibility.

SUMMARY OF THE INVENTION

According to the invention, therefore, there is provided a method for producing an electrically conductive pattern on an electrically non-conductive surface comprising dispensing an electrically conductive powder over the surface, applying a heat actuable adhesive means to said surface, selectively heating said powder in said pattern whereby to activate said adhesive means to bond said powder to said surface in said pattern, and removing from said surface powder which remains unbonded.

Preferably the adhesive is a temporary thermoplastic adhesive and subsequent to removal of the powder, the surface is heated to cure the powder and remove the remaining non-activated thermoplastic adhesive.

Preferably the powder includes means for bonding to the surface so that the curing at high temperature activates the bonding between the material in the powder and the surface to bond the conductive part of the powder in a circuit line to the surface.

The heating of the powder can either be carried out by a laser or other focused beam, or it can be carried out by contact between a heated master plate and the powder, the latter process applying pressure and heat at the same time in the predetermined pattern.

This process does not therefore involve etching or require masks to establish the circuit pattern. The irradiation or heating may be achieved by using a laser to directly write the circuit pattern onto the surface. This therefore leads to much improved flexibility since the laser can be moved to any required position to write the required circuit pattern. In addition, computer or robotics control of the laser can be used to obtain the necessary movement automatically providing both the desired circuit line location and width. Furthermore, the non-heated powder can be re-used by simply removing the powder from the surface since its properties and consistency are not in any way modified except in the areas where bonding has taken place in view of the heating applied. The robotics control can enable manufacture of different circuits without costly and lengthy manufacture of masks or plates.

The adhesive layer which may be permanent or temporary can be provided between the surface and the conductive powder in the form of a powder or a film. In another arrangement the adhesive may form part of the conductive powder.

The powder may be applied to the surface by any suitable method for example sprinkling, electrostatic deposition, brushing, rollering or screening. The non-activated powder can also be removed by any suitable process for example vacuum, brushing, compressed air blowing, or washing with a solvent. The cleaning step may also take place before or after the circuit lines are fired or cured onto the surface.

Various chemical elements and compounds which are conductive may be used in the conductive powder for example gold, silver, copper, indium, lead, tin, nickel, aluminum, antimony, arsenic, bismuth, cadmium, gallium, germanium, silicon, palladium. Using elements or compounds having varying electrical conductive properties may also allow for the fabrication of resistive circuitries in a controlled method.

The substrate or surface may be in the form of rigid or flexible sheets or films or may have a threedimensional shape. There are numerous materials which are suitable as the substrate material for example ceramic, alumina, porcelainized steel, steatite, beryllia, glass, epoxy glass, polysulfone, polyimide, polyester, polycarbonate, polyurethane. The substrate material should be chosen so that there is a good match for wetting between the conductive powder and the surface both during the irradiation process and more particularly during the curing process. Particularly as necessary that there is fusion or bonding between the two layers during the curing process since otherwise surface tension can cause the conductive powder to ball up and break away from the surface. The irradiation must sufficiently affect or treat the conductive powder to promote a bond between the conductive powder and the surface. This allows for the circuitry to become distinct and defined from non-circuitry areas.

Control of the focus or beam width or irradiation allows for the generation of various circuit line widths.

The laser beam particularly lends itself to a form of irradiation which can be controlled in application. The laser beam may be controlled by means of a predetermined programmed line motion. Processes and devices for regulating the laser beam by computers, as well as for the bundling, modulation and deflection of the beam, that may be used in the process of the invention have been disclosed on a number of occasions. (German Offlegungsschriften Nos. 2,318,133, pages 3 et seq., and 2,344,233, pages 8 et seq., and in U.S. Pat. Nos. 3,751,587, 3,745,586, 3,747,586, 3,747,117, 3,475,760, 3,506,779 and 3,664,737).

By use of fiber optics, multiple laser beams can be simultaneously controlled to produce multiple circuits. Through the use of robotics to direct the laser beam in a predetermined programmed motion, irregular or three dimensional substrates may be used by this invention. This invention is not intended to restrict its use to lasers for providing the irradiation.

Additionally, the beam or irradiation may remain stationary, and the circuit pattern generated by the predetermined programmed movement of the substrate. Processes exist for fixturing the substrate and for the controlled movement of the fixture. (for example CNC machining methods).

The beam of irradiation may be controlled to extremely high tolerances allowing for the manufacture of very precise and repeatable circuit patterns.

Due to the nature of the type of irradiation, and/or material composition of the conductive or substrate layers, it may be necessary to perform the irradiation process in a controlled environment. This environment may require operating in a vacuum or in an inert gas or combination of gases. It is also possible to provide operation in a gas which acts as a flux.

With the foregoing in view, and other advantages as will become apparent to those skilled in the art to which this invention relates as this specification proceeds, the invention is herein described by reference to the accompanying drawings forming a part hereof, which includes a description of the best mode known to the applicant and of the preferred typical embodiment of the principles of the present invention, in which:

DESCRIPTION OF THE DRAWINGS

In the drawings like characters of reference indicate corresponding parts in the different figures.

DETAILED DESCRIPTION

In the figures a substrate is indicated at 10 including an upper surface 11 onto which circuit lines are to be formed. Onto the surface is deposited a film or layer 12 of an adhesive material as explained in more detail hereinafter. On top of the adhesive film 12 is deposited a layer 13 of conductive powder.

Figure 1:
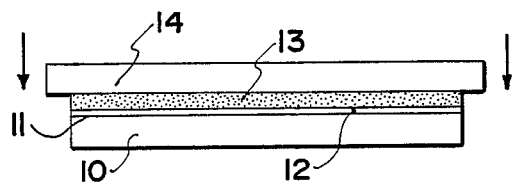
FIG. 1 is a schematic cross sectional view showing a step of a first process according to the invention.

In FIG. 1 the powder has been applied and is in the process of being compressed by a flat sheet so as to even the layer of powder and to ensure a substantially constant density. The flat sheet is indicated at 14.

Figure 2:
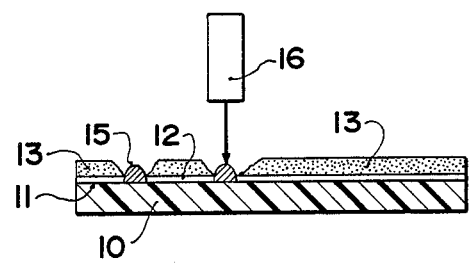
FIG. 2 is a view similar to FIG. 1 showing a second step in the process.

In FIG. 2 the flat sheet 14 is removed and a number of circuit lines 15 are formed by irradiating the powder and adhesive film with a laser 16 which activates the adhesive film and temporarily bonds the conductive power to the substrate.

Figure 3:
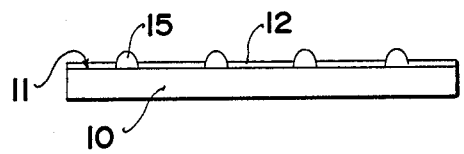
FIG. 3 is a similar view to FIG. 1 showing a third step in the process.

In FIG. 3, the excess powder which has not been activated is removed as explained in more detail herein.

Figure 4:
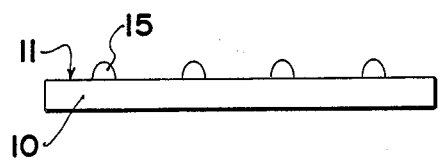
FIG. 4 is a similar view to FIG. 1 showing a resultant circuit board.

In FIG. 4 a resultant product is formed by firing or curing the intermediate product of FIG. 3 so that the adhesive layer 12 is burnt off and the conductive lines 15 are cured or fired to complete a bonding or fusion with the surface 11 of the substrate 10.

Figure 5:
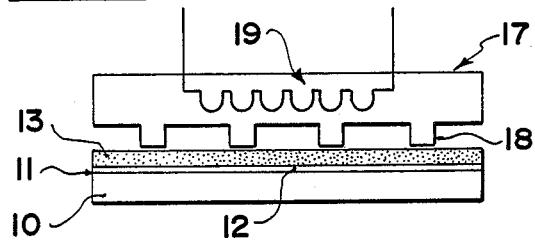
FIG. 5 is a similar schematic cross sectional view showing a modified process incorporating the steps of FIGS. 1 and 2 into a single step.

FIG. 5 shows a modified process in which the compression of FIG. 1 and the activation step of FIG. 2 are combined into a single step using a master plate 17 which has a number of lines or ridges 18 which are heated as schematically indicated at 19 so that the lines or ridges 18 activate and simultaneously compress the power and adhesive film at the required locations.

The invention will now be further described in relation to the following examples which, while in no way intended to be limiting, give further explanation of materials which may be suitable.

EXAMPLE 1

(1) Substrate material was obtained from Ceramics Unlimited, Division of Lasermation Inc., and consisted of 2"×2", as fired alumina, 99.5%/99.6% pure and approximately 0.025 inches thick. All substrate pieces were cleaned as follows:
wash and mildly scrubbed in soap water
rinse thoroughly in water and air dryed
cleaned in isopropyl alcohol (rubbing)
rinsed with distilled water and dryed
spray rinsed with freon and air dryed.

(2) Copper conductor composition 9924, by Dupont, is a thick film paste material. This process involves the use of a powder, however this material has characteristics which are expressed as being particularly suitable for bonding to alumina substrates. Due to the copper composition it is classed as nitrogen-fireable and glass-bonded.

In order to convert this material into a powder small samples were first heated to 120 degrees C., in an attempt to dry it. The drying time was only 15–20 minutes and due to the mass of the paste it was probably insufficient.

Some time was spent experimenting by dissolving the paste in freon and pouring the solution into a small teflon coated pan. After evaporation of the freon, a thin material scale was left on the pan. This was gently scraped and collected as a powder. The remainder of the paste was dissolved in freon and poured into metal pans. These were then dryed in an oven at 120 degrees C. for about five hours.

The deposited "scale" was gently scraped off and poured, in small portions, into a mortar and pestle. Here it was finely crushed and ground. A glass jar was used to collect the very fine powder. The mouth of the jar was covered by by a nylon mesh which acted as a sieve. This was continuously repeated until enough powder was collected (appro. 25 gm.).

Finally, a silkscreen mesh, as used in the printing industry, was used in place of the nylon. The material is called #305 Fintex (trade mark). This mesh size was tested to see if a fine powder could be sprinkled out (5–45 microns). It was found to be successful.

(3) Three alumina boards, as prepared in step 1, were given a temporary adhesive coating using Wafer-Mount (trade mark) temporary film adhesive #562. This material is manufactured by Aremco Products, Inc., and consists of a dry film approximately 0.003" thick. The material melts at 195–210 degrees F., and can be dissolved in trichloroethylene or toluene.

Pieces were cut from a sheet with resultant dimensions corresponding to the alumina board sizes. An oven was preheated to about 200 degrees F. The boards were given a thin wash of isopropyl alcohol and the #562 film placed on top and all trapped air bubbles were squeezed out. This provided a close contact between the alumina and the adhesive film and was found to substantially reduce the number of entrapped air bubbles under a melted film. The alumina and adhesive film were then placed in the oven for approximately 15 minutes. After melting, a smooth surface of adhesive was observed.

(4) The material prepared in step 2, hereinafter called copper powder, was evenly sprinkled over the entire surface of the alumina boards. This was done by hand and visual judgment was used to obtain a consistent and uniform coating.

(5) Thin aluminum metal plates were heated to approximately 220 degrees F. and then quickly used to press down the powder, reflowing the adhesive film and bonding the copper powder to it and the substrate. The edges of the plates were used and had thicknesses of about 0.060, 0.025 and 0.010 inches. The time of application of the heated plates was 1–6 seconds.

(6) The excess powder was first brushed and then blown away using a photographic blower brush. A thin film of powder remained and this was gently rubbed away by using a tissue and isopropyl alcohol. A white-gum eraser was also used to clean up areas between circuit lines, providing a clean looking surface.

(7) Good temporary bonding and circuit line definition was observed on the first and second boards. The third board was not as good since the metal plates were heated to only 190 degrees F., and this did not sufficiently reflow the adhesive film.

(8) The alumina boards were all fired in a Lindberg furnace equipped with a retort. Nitrogen gas was fed into the retort and the atmosphere was constantly purged using the nitrogen gas. The furnace was heated to about 900 degrees C. which is the recommended temperature for curing of the copper conductor composition #9924.

EXAMPLE 2

(1) Two boards, as prepared in step 1, were given the following adhesive coating. Aremco #555 Crystalbond (trade mark) temporary wash-away adhesive was prepared by grinding it into a fine powder by using a mortar and pestle. #555 is a thermoplastic monomer with a softening point of 125 degrees F. and a flow point of 130 degrees F. This material is also water soluble.

(2) The powder was dissolved in distilled water to form a highly saturated solution. The liquid was strained through #420 Fintex silkscreen mesh to remove any particulates. The #555 liquid solution was applied to the 2"×2" alumina boards using a small sponge type paint brush. The surface was continuously dry-rebrushed as it air dryed to assure a thin uniform coating. The boards were placed in a 150 degrees F. oven and a smooth re-flowing of the #555 adhesive was observed.

(3) The above coating was found not to be thick enough, so it was used as a base and was found to overcome surface wetting problems to the alumina. To obtain a thicker coating, the #555 powder was evenly sprinkled onto the initial #555 coating, using a nylon mesh.

The boards were then put in a 160 degrees F. over to completely reflow the powder and form a fairly thick and uniform coating. The boards were then allowed to cool to room temperature.

(4) The copper powder was evenly sprinkled onto the boards. Thin metal plates were heated to approximately 150 degrees F. in an oven. the size and type of plate is as described in step 6 of Example 1. Trial and error was required to heat and melt the copper powder into the #555 adhesive coating. Overheated plates caused smeared circuit lines, and by allowing the plates to air cool and successively retrying, good circuit line impressions were obtained.

(5) Subsequently, the copper powder areas not heated by the plate edges were removed by brushing and blowing using a photographic blower brush. The non-circuit areas were gently cleaned by mild rubbing with a white-gum eraser to remove any possible trace of copper powder.

(6) The boards were fired in accordance with step 8 of Example 1.

EXAMPLE 3

(1) Three boards and adhesive layer were formed in accordance with steps 1 through 3 of Example 1.

(2) Copper powder was used as described in step 4 of Example 1 and sprinkled evenly over the boards labeled A, B and C.

(3) Board A—The powder was sprinkled only (no compression)

Circuit lines were traced with laser beam and the sample "pushed" at various speeds.

Board B

Same as above except the copper powder was pressed flat on the adhesive/alumina surface using a small piece of ¼" plate glass.

Board C

Powder was "pressed".

Various "push" speeds

Laser current raised to 6 ma. laser voltage to 9.0 KV.

(4) The boards were then irradiated using the following laser set-up:

CO2 laser was manufactured by Coherent Radiation, Palo Alto, Calif. Model 42 Industrial Laser.

45 degree deflection mirror was made by the experimentor using a first surface elliptical diagonal mirror commonly used in the manufacture of telescopes. Size 1.25" minor axis and obtained from Efstonscience.

Beam focusing lens made by Coherent Radiation lens LS-33, 3.8 cm E.F.L., 10.6 microns.

The laser was water cooled and had the following input passes: Helium, Carbon Dioxide and Nitrogen.

Various power settings were tried, however the following settings were found to be best for all of the following experimental steps:

Laser current 4 ma

Laser voltage 9.0 KV

A 45 degree deflection mirror was used because the laser beam exit and travel was parallel to the granite surface table. A 90 degree beam deflection was required so that the experiments could be run on a horizontal surface.

The focusing lens was required as the emitted beam had an approximate diameter of 0.25". The lens reduced the laser beam diameter to about 0.050".

A wooden ruler was used as a guide bar. The 2"×2" alumina boards were pushed against this guide bar and directed under the focused beam by using a push rod. This provided a straight line path of the beam on the board to stimulate the writing of a circuit line. Due to the crude nature of the set-up, speed of the board could not be determined.

However, for each alumina board several circuit lines were written at various speeds to judge the effects. The guide bar was moved in small increments to utilize the entire 2"×2" surface.

The speed of travel did not seem to have a critical effect on the success of reflowing either adhesive #555 or #562. It did have a slight affect on the circuit line widths and this was probably due to heat dispersion through the copper powder at the slower speeds.

(5) The three boards were then cleaned of excess copper powder. This was done by gently tapping the backside of the 2"×2" alumina board, brushing with a photographic blower brush and gentle wiping with a fine tissue. All excess copper powder was easily removed leaving behind the circuit lines which showed good definition and bonded well to the temporary adhesive coatings. This method of circuit "writing" was found to be much easier in comparison to the previous methods using heated metal plates.

(6) The boards were then field in accordance with step 8 of Example 1.

EXAMPLE 4

(1) Three boards were formed in accordance with steps, 1, 2 and 3 of Example 2.

(2) Copper powder was sprinkled evenly over the boards as previously described.

(3) The boards were then irradiated in accordance with steps 4 and 5 of Example 3 and fired in accordance with step 8 of Example 1.

RESULTS (1) The boards were then examined. The temporary adhesive coating #555 did not burn-off as cleanly as did the coating of #562. However, the adherence of the copper powder to the alumina substrate was qualitatively found to be stronger with the #555 boards. Circuit line bonding strength was found to be much weaker in the boards of Examples 1 and 3.

Due to some of the residues observed and the oxidation observed on the circuit lines it was felt that an unclean condition of the furnace lead to this situation. The furnace was previously used in industrial applications and the heat treating of metals.

(2) Precise surface resistivity measurements of the circuit lines was not obtained due to the unavailability of equipment. A simple volt-ohm-meter was used to measure the DC resistance of various circuit lines. The lowest resistance scale of X1 ohm was used and probes were used to take the resistance readings.

The boards of Examples 2 and 4 displayed the best resistance values for the circuit lines and were under 1 ohm. Similar low resistance values were observed on the boards of Examples 1 and 3 but problems occurred due to the poor adhesion of the circuit line.

(3) It was felt that superior results could be obtained by the supply of a proper powder composition of 9924 direct from Dupont. The conversion of their "paste form" to "powder form" probably detracted from some of the materials specific bonding and non-oxidizing characteristics. Additionally, the furnace type and the temperature curing profile used was not as recommended by Dupont. The uncleanliness of the furnace probably lead to some of the oxidation observed on the circuit lines.

In order to manufacture a multi-layer circuit, it is possible to apply the same technique over the first circuit using a non-conductive powder which is then written and cured into a non-conductive covering leaving spaces for communication between the first circuit and a second circuit formed by the same technique as the first on top of the non-conductive layer.

Since various modifications can be made in my invention as hereinabove described, and many apparently widely different embodiments of same made within the spirit and scope of the claims without departing from such spirit and scope, it is intended that all matter contained in the accompanying specification shall be interpreted as illustrative only and not in a limiting sense.

I claim:

1. A method of producing a circuit board comprising an electrically conductive pattern on an electrically non-conductive surface, the method comprising taking a circuit board substrate having an electrically non-conductive surface thereon, applying a layer of a heat actuable adhesive to said surface, loosely dispensing onto said layer an electrically conductive powder consisting of elemental metal in such a manner that the powder remains unbonded to the surface and can be readily removed therefrom, selectively heating said powder in said pattern to a temperature sufficient only to activate said adhesive without affecting the powder to adhesively bond said powder to said surface in said pattern, and removing from said surface powder which remains unbonded.

2. A method of producing a circuit board comprising an electrically conductive pattern on an electrically non-conductive surface, the method comprising taking a circuit board substrate having an electrically non-conductive surface thereon, loosely dispensing onto said surface a powder in such a manner that the powder remains unbonded to the surface and can readily be removed therefrom, said powder consisting of a mixture of a heat actuable adhesive powder and an electrically conductive elemental metal powder, selectively heating said powder in said pattern to a temperature sufficient only to activate said adhesive powder without affecting said metal powder to bond said metal powder to said surface in said pattern, and removing from said surface said powder which remains unbonded.

3. The invention according to claim 1 wherein said adhesive means is applied as a film.

4. The invention according to claim 1 wherein said adhesive means comprises a thermoplastic adhesive and, subsequent to removing powder from said surface, said surface is heated to cure said powder and remove said thermoplastic adhesive.

5. The invention according to claim 4 wherein said powder includes means activated by said heat to permanently bond said powder to said surface as said conductive pattern.

6. The invention according to claim 1 wherein simultaneously with said heating of said powder in said pattern, pressure is applied to said powder in said pattern whereby said powder is bonded to said surface by heat and pressure.

7. The invention according to claim 1 wherein prior to selectively heating said powder, pressure is applied to said powder over all of said surface to compress the powder into contact with said surface.

8. The invention according to claim 1 wherein said selective heating is carried out by a laser.

9. The invention according to claim 6 wherein said simultaneous heating and pressure is applied by a master pattern which is pressed into contact with said powder and heated to a temperature sufficient to activate said adhesive means.

10. The invention according to claim 2 wherein said adhesive powder comprises a thermoplastic adhesive and, subsequent to removing said powder from said surface, said surface is heated to cure said metal powder and to remove said thermoplastic adhesive powder.

11. The invention according to claim 10 wherein said powder includes means activated by said heating of said surface to cure said metal powder to permanently bond said metal powder to said surface as said conductive pattern.

12. The invention according to claim 2 wherein simultaneously with said heating of said powder in said pattern, pressure is applied to said powder in said pattern whereby said metal powder is bonded to said surface by heat and pressure.

13. The invention according to claim 2 wherein prior to selectively heating said powder pressure is applied to said powder over all of said surface to compress said powder into contact with said surface.

14. The invention according to claim 2 wherein said selective heating is carried out by a laser.

15. The invention according to claim 2 wherein said simultaneous heating and pressure is applied by a master pattern which is pressed into contact with said powder and heated to a temperature sufficient to activate said adhesive powder.

* * * * *